US012762387B2

(12) United States Patent
Park et al.

(10) Patent No.: US 12,762,387 B2
(45) Date of Patent: Oct. 13, 2026

(54) SEMICONDUCTOR DEVICE INCLUDING OVERPASS-TYPE CHANNEL

(71) Applicant: SEOUL NATIONAL UNIVERSITY R&DB FOUNDATION, Seoul (KR)

(72) Inventors: Byung-Gook Park, Seoul (KR); Tae Jin Jang, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 987 days.

(21) Appl. No.: 17/987,234

(22) Filed: Nov. 15, 2022

(65) Prior Publication Data

US 2023/0153590 A1 May 18, 2023

Related U.S. Application Data

(63) Continuation of application No. PCT/KR2022/013956, filed on Sep. 19, 2022.

(30) Foreign Application Priority Data

Nov. 18, 2021 (KR) ........................ 10-2021-0159121
Jun. 9, 2022 (KR) ........................ 10-2022-0070131

(51) Int. Cl.
*G06N 3/063* (2023.01)
*H10B 43/30* (2023.01)
(Continued)

(52) U.S. Cl.
CPC ............. *G06N 3/063* (2013.01); *H10B 43/30* (2023.02); *H10D 30/6215* (2025.01);
(Continued)

(58) Field of Classification Search
CPC .... G06N 3/063; G06N 3/065; H10D 30/6215; H10D 30/69; H10D 30/711; H10D 62/292; H10D 30/62; H10D 64/037; H10B 43/30
See application file for complete search history.

(56) References Cited

U.S. PATENT DOCUMENTS 9,431,099 B2 * 8/2016 Lee ......................... G11C 11/54
2016/0133317 A1 * 5/2016 Lee .................... H10D 30/6757
257/314
(Continued)

FOREIGN PATENT DOCUMENTS

JP 2019009209 1/2019
KR 20140079468 6/2014
(Continued)

*Primary Examiner* — Earl N Taylor
(74) *Attorney, Agent, or Firm* — CANTOR COLBURN LLP

(57) ABSTRACT

Provided is an overpass-type semiconductor device and an overpass-type semiconductor device including a channel layer that overpasses a fin of a first gate. The overpass-type semiconductor device includes: a first gate including a fin having a preset height; a charge storage layer formed on the first gate and the fin; a channel layer formed on a part of the charge storage layer; a gate insulating layer formed on the channel layer; and a second gate formed on the gate insulating layer. The fin protrudes in a height direction from a center of the first gate, and the channel overpasses the fin.

9 Claims, 7 Drawing Sheets

(51) Int. Cl.

| | |
|---|---|
| ***H10D 30/62*** | (2025.01) |
| ***H10D 30/69*** | (2025.01) |
| ***H10D 62/17*** | (2025.01) |
| ***H10D 64/01*** | (2025.01) |

(52) U.S. Cl.

CPC ........... *H10D 30/69* (2025.01); *H10D 30/711* (2025.01); *H10D 62/292* (2025.01); *H10D 64/037* (2025.01)

(56) References Cited

U.S. PATENT DOCUMENTS

| | | | | |
|---|---|---|---|---|
| 2020/0219446 | A1* | 7/2020 | Yoshida | G09G 3/3291 |
| 2021/0034953 | A1* | 2/2021 | Pesic | G11C 11/54 |
| 2021/0098484 | A1* | 4/2021 | Zhu | H10D 30/697 |
| 2021/0098488 | A1* | 4/2021 | Zhu | H10D 64/037 |
| 2021/0098587 | A1* | 4/2021 | Zhu | H10D 30/697 |
| 2021/0098611 | A1* | 4/2021 | Hersam | G11C 13/0007 |
| 2021/0226011 | A1* | 7/2021 | Lee | H10D 30/47 |
| 2022/0285381 | A1* | 9/2022 | Park | G11C 16/0416 |
| 2023/0092244 | A1* | 3/2023 | Sato | H10D 99/00 257/43 |

FOREIGN PATENT DOCUMENTS

| | | | | |
|---|---|---|---|---|
| KR | 101425857 | | 7/2014 | |
| KR | 101517915 | | 5/2015 | |
| KR | 101526554 | | 6/2015 | |
| KR | 101695737 | B1 * | 1/2017 | G11C 11/54 |
| KR | 101707849 | | 2/2017 | |
| KR | 20180072942 | | 7/2018 | |
| KR | 20180076314 | | 7/2018 | |
| KR | 101894439 | B1 | 9/2018 | |
| KR | 102227365 | B1 | 3/2021 | |
| KR | 20210027995 | | 3/2021 | |
| KR | 20210027995 | A * | 3/2021 | H10D 30/683 |

* cited by examiner

SEMICONDUCTOR DEVICE INCLUDING OVERPASS-TYPE CHANNEL

BACKGROUND

1. Field

The present disclosure relates to a semiconductor device including an overpass-type channel, and more particularly, to a semiconductor device used for a hardware-based neural network.

2. Description of the Related Art

Recently, along with the development of a computing technology based on artificial neural networks, research and development of spiking neural networks (SNNs) have been actively conducted. The spiking neural network started from imitation (concepts for memory, learning, and inference) of an actual biological nervous system, but only a similar network structure is adopted, and there is a difference from a nervous system in various aspects, such as a signal transmission and information expression method and a learning method.

Meanwhile, in relation to a hardware-based SNN which operate almost identically to the real nervous system, a learning method that outperforms existing neural networks has not yet been developed, and thus, the SNN is rarely used in the real industry. However, when a synaptic weight is derived by using the existing neural network and inference is performed by using the synaptic weight through an SNN method, a high-accuracy and ultra-low-power computing system may be implemented, and thus, research thereon is being actively conducted.

In such a neural network, a large number of synapses are arranged between neurons, and the synapses serve to store weights and transmit signals between neurons.

Since a large number of synapses and neurons are required for a complex network, research on high integration is being actively conducted. In addition, since power consumption due to a current flowing in the large number of synapses is increased, it is important to reduce the current. However, there are problems such as short channel effect and reduction in the number of multi-level weights due to high integration.

SUMMARY

An embodiment of the present disclosure provides a semiconductor device including an overpass-type channel for increasing an effective channel length.

In addition, an embodiment of the present disclosure provides a semiconductor device including an overpass-type channel for stabilizing a weight of a synaptic device.

However, the technical object to be achieved by the present embodiment is not limited to the above-described technical objects, and there may be other technical objects.

According to an aspect of the present embodiment, an overpass-type semiconductor includes a first gate including a fin having a preset height, a charge storage layer formed on the first gate and the fin, a channel layer formed on a part of the charge storage layer, a gate insulating layer formed on the channel layer, and a second gate formed on the gate insulating layer, wherein the fin protrudes in a height direction from a center of the first gate, and the channel overpasses the fin.

In addition, according to an aspect of the present embodiment, an overpass-type semiconductor device includes a source and a drain formed in a channel to be separated from each other by a preset distance on both sides of a fin, and the drain shares the same voltage line as a second gate. The second gate includes end portions extending on both sides of the fin.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
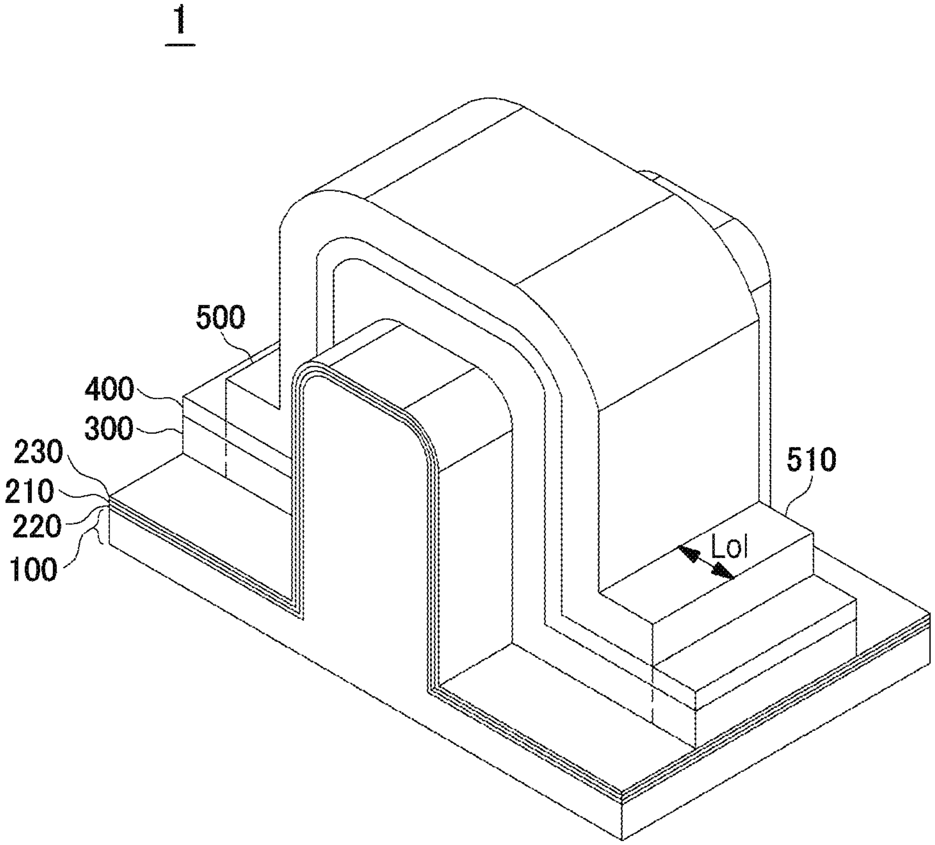
FIG. 1 is a conceptual perspective view of a semiconductor device according to an embodiment of the present disclosure.

Hereinafter, embodiments of the present disclosure will be described in detail with reference to the accompanying drawings such that those skilled in the art to which the present disclosure belongs may easily implement the present disclosure. However, the present disclosure may be embodied in various different forms and is not limited to the embodiments described herein. In addition, in order to clearly illustrate the present disclosure in the drawings, parts irrelevant to the descriptions are omitted, and similar reference numerals are attached to similar parts throughout the specification.

Throughout the specification, when a portion is “connected” or “coupled” to another portion, this includes not only a case of being “directly connected or coupled” but also a case of being “electrically connected” with another element interposed therebetween. In addition, when a portion “includes” a certain component, this means that other components may be further included therein rather than excluding other components, unless otherwise stated.

Throughout this specification, when a member is located “on” another member, this includes not only a case in which a member is in contact with another member but also a case in which there is another member between the two members.

In addition, the accompanying drawings are only for easy understanding of the embodiments disclosed in the present specification, and the technical idea disclosed herein is not limited by the accompanying drawings, and the present disclosure should be understood to include all changes, equivalents, and substitutes included in the idea and scope of the present disclosure.

Terms including ordinal numbers such as first, second, and so on may be used to describe various components, but the components are not limited by the terms. The terms are used only for the purpose of distinguishing one component from another component.

When a component is referred to as being “connected” or “coupled” to another component, the component may be directly connected thereto or coupled thereto, but it is understood that another component may exist therebetween. Meanwhile, when it is described that a certain element is “directly connected” or “directly coupled” to another element, it should be understood that there is no component therebetween.

The singular expression includes the plural expression unless the context clearly states otherwise.

In the present application, terms such as “include”, “comprise”, or “have” are intended to designate that there are features, numbers, steps, operations, components, portions, or combination thereof described in the specification, and it should be understood that the terms do not preclude a possibility of addition or existence of one or more other features, numbers, steps, operations, components, portions, or combinations thereof.

Hereinafter, a structure of a semiconductor device 1 according to an embodiment of the present disclosure will be described with reference to FIGS. 1 and 2.

Figure 2:
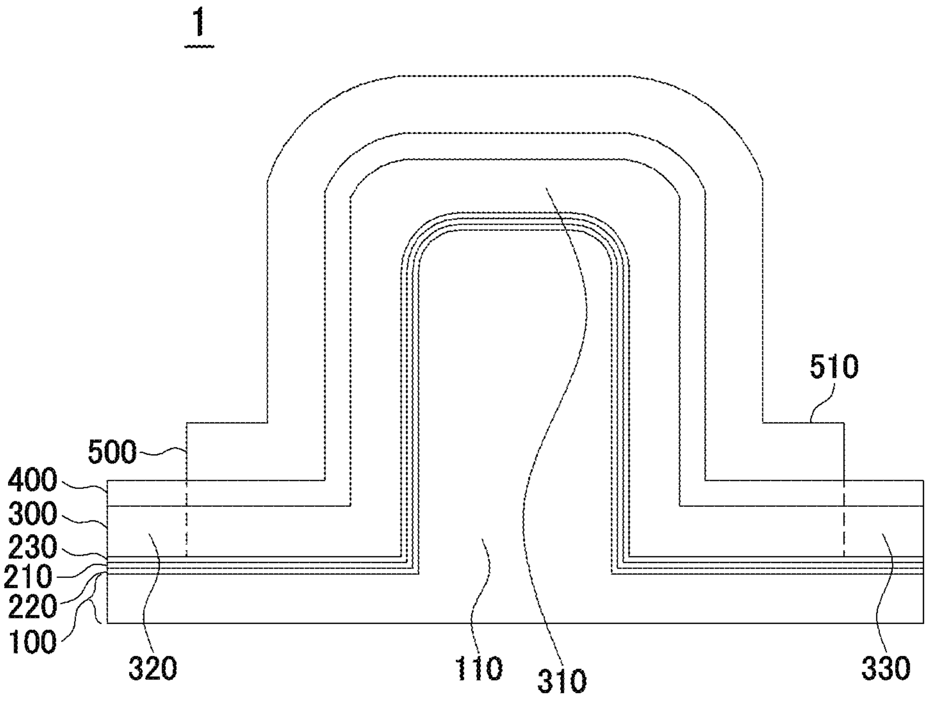
FIG. 2 is a conceptual cross-sectional view of the semiconductor device according to the embodiment of the present disclosure.

FIG. 1 is a conceptual perspective view of the semiconductor device 1 according to the embodiment of the present disclosure, and FIG. 2 is a conceptual cross-sectional view of the semiconductor device 1 according to the embodiment of the present disclosure.

Referring to FIGS. 1 and 2, the semiconductor device 1 according to the embodiment of the present disclosure includes a first gate 100, a charge storage layer 210, a channel layer 300, an insulating layer 400, and a second gate 500.

The first gate 100 may include a fin 110 having a preset height and a preset upper area. The fin 110 may protrude from the center of the first gate 100 in a height direction.

Any material layer capable of storing holes may be used as the charge storage layer 210. For example, the charge storage layer 210 may be formed of a nitride film. In addition, the charge storage layer 210 may include a tunneling insulating layer 230 formed between the charge storage layer 210 and the channel layer 300.

The charge storage layer 210, a blocking insulating layer 220, and the tunneling insulating layer 230 may form a gate insulating layer stack 210, 220, and 230. In addition, each of the tunneling insulating layer 230 and the blocking insulating layer 220 may be formed of an oxide layer. As described above, the tunneling insulating layer 230, the charge storage layer 210, and the blocking insulating layer 220 may be formed of a material having an oxide-nitride-oxide (ONO) structure.

Since the fin 110 protrudes from the center of the first gate 100 in the height direction, the channel layer 300 passes the fin 110. Accordingly, a length of an effective channel may be extended by twice the height of the fin 110.

The channel layer 300 includes a source 320 and a drain 330 separated from each other by a preset distance on both sides of the fin 110. A floating body 310 is formed between the source 320 and the drain 330.

The second gate 500 is formed on the channel layer 300. The gate insulating layer 400 may be formed between the second gate 500 and the channel layer 300 or the floating body 310. The second gate 500 and the gate insulating layer 400 also have an overpass shape.

In addition, the second gate 500 includes an end portion 510 extending in a horizontal direction on both sides of the fin 110. In this case, a magnitude of a threshold voltage shift may be changed according to a length of the end portion 510 in the semiconductor device 1 according to the embodiment of the present disclosure. The threshold voltage shift along the length of the end portion 510 will be described in detail with reference to FIG. 5 to be described below.

The floating body 310 may be formed of a first-conductivity type (for example, p-type) semiconductor material to be electrically isolated from surroundings thereof. The source 320 and the drain 330 may be formed of a second-conductivity type (for example, n-type) semiconductor material of a type opposite to the first conductivity type. In addition, the source 320 and the drain 330 may be formed to be in contact with both sides of the floating body 310 with the floating body 310 interposed therebetween and to be isolated from each other.

The floating body 310 may have at least one grain boundary between the source 320 and the drain 330 and may use the grain boundary as a charge storage.

The floating body 310 is electrically isolated from the surroundings including the source 320 and the drain 330 and may store carriers (excess holes or electrons) generated by impact ionization in itself. By storing the carriers in the grain boundary formed of a semiconductor material forming the floating body 310, channel conductivity may be affected even when a body thickness of a device is smaller than the greatest thickness of a depletion layer (not illustrated) generated at a boundary between the source 320 and the drain 330.

A specific structure for the floating body 310 to be electrically isolated from surroundings may be formed in various ways. First, the floating body 310 may have a different semiconductor conductivity type from the source 320 and the drain 330 on both sides thereof to isolated as a depletion layer (depletion region) by a pn junction and may be isolated from other surroundings with an insulating layer or an air layer therebetween or in a non-contact manner. The floating body 310 may be isolated from surroundings other than the source 320 and the drain 330 as a depletion region by a pn junction.

The grain boundary may also be formed only in a channel region (not illustrated), in which a channel is formed during operation, between the source 320 and the drain 330, and may also be formed only under the channel region and may also be formed in the entire region of the floating body 310 including the channel region. In this case, the grain boundary may be formed only under the channel region of the floating body 310. However, in consideration of a process aspect, it is easy to form the grain boundary in the entire region of the floating body 310.

When the grain boundary is formed in the channel region, some of carriers (drive carriers) injected from the source 320 may be stored in the grain boundary, thereby affecting channel conductivity during a subsequent drive, and thus, there is an advantage in that the grain boundary induces excess holes through impact ionization in the depletion region on the drain 330 side to be used in a short-term memory device.

In addition, in a structure in which the first gate 100 is further formed at a position facing the second gate 500 with the floating body 310 therebetween, a gate insulating layer stack including the charge storage layer 210 and the first gate

100 is provided to implement a non-volatile memory device simultaneously or to implement a synaptic mimic device that may be converted into a long-term memory.

The gate insulating layer stack 210, 220, and 230 including the charge storage layer 210 may be formed between the floating body 310 and the first gate 100. Here, any material layer capable of storing holes may be used for the charge storage layer 210, and for example, a nitride film may be used for the charge storage layer 210. In addition, the tunneling insulating layer 230 and the blocking insulating layer 220 included in the gate insulating layer stack 210, 220, and 230 may be formed of an oxide layer.

The floating body 310 may be formed of a polycrystalline semiconductor material having a clear grain boundary, such as polysilicon or polygermanium. In addition, the floating body 310 may be formed of an amorphous semiconductor material.

As described above, the floating body 310 is formed of a polycrystalline or amorphous semiconductor material instead of a single-crystal semiconductor substrate, and thus, three-dimensional stacking may be formed.

As the channel layer 300 overpasses the fin 110, a length of an effective channel may be extended by twice the height of the fin 110. Accordingly, the length of the effective channel increases, and a weight of a semiconductor device may be precisely adjusted with a low power.

The drain 330 may share the same voltage line with the second gate 500. As the drain 330 and the second gate 500 share the same voltage line, a size of the semiconductor device 1 may be reduced by half. In addition, it is possible to overcome limitations of miniaturization of a four-terminal structure.

In addition, when the semiconductor device 1 performs an inference operation, the same voltage is applied to the second gate 500 and the drain 330. Accordingly, an event-driven operation of outputting an output signal from a source line may be performed. In addition, the semiconductor device 1 may precisely control weights of individual semiconductor devices with a low power through Fowler-Nordheim tunneling.

Figure 3:
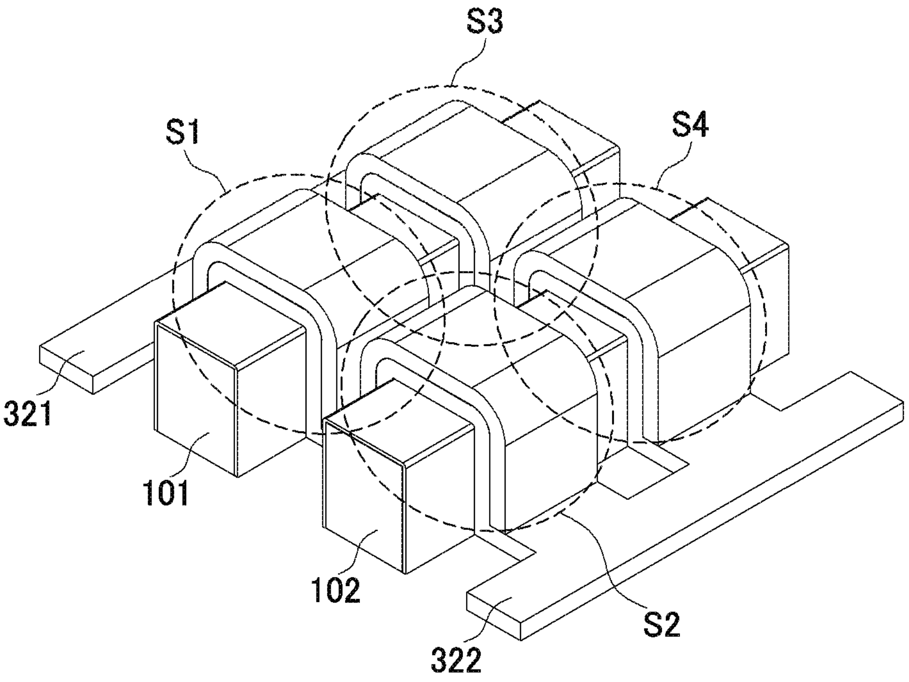
FIG. 3 is a conceptual perspective view of a four-terminal structure according to an embodiment of the present disclosure.
Figure 4:
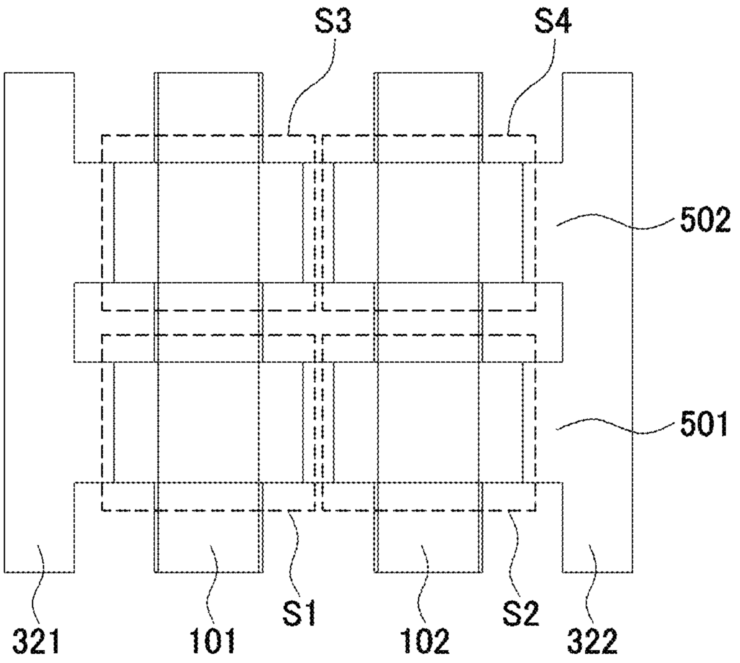
FIG. 4 is a conceptual plan view of the four-terminal structure according to the embodiment of the present disclosure.

FIGS. 3 and 4 illustrate an example of a structure of a four-terminal structure (synaptic array) including four semiconductor devices. By using the synaptic array illustrated in FIGS. 3 and 4, a neural network including the synaptic array as cells may be configured.

Hereinafter, when a synaptic array is configured by using a semiconductor device according to an embodiment of the present disclosure, a method of controlling an operation of the synaptic array will be described with reference to FIGS. 3 to 5.

First, in the synaptic array according to the embodiment of the present disclosure, as the second gate 500 line and the drain 330 line are integrated with each other, when no input voltage is applied to the second gate 500, a voltage difference between the second gate 500 and the drain 330 is maintained at 0 V. Accordingly, a leakage current may be reduced greatly.

As illustrated in FIGS. 3 and 4, a first device S1 and a second device S2 share one second gate and a drain line 501, and a third device S3 and a fourth device S4 share another second gate and a drain line 502. An input signal may be simultaneously input to the second gate line and the drain lines.

The first device S1 and the third device S3 share a first gate line 101 and a source line 321. In addition, the second device S2 and the fourth device S4 share a second gate line 102 and a source line 322. The source line may output an output signal. Accordingly, an event-based operation may be performed.

In order to set a synaptic weight of a device, any one semiconductor device for which the synaptic weight is to be set among the first device S1 to the fourth device S4 is set as a target semiconductor device. The weight of the target semiconductor device may be set by applying a first voltage to a first gate of the target semiconductor device and applying a second voltage to a second gate and a drain of the target semiconductor device.

In addition, the second voltage is applied to the first gates of the other semiconductor devices other than the target semiconductor device. In addition, a synaptic array may be controlled by applying the second voltage or a third voltage to the second gates and the drains of the other semiconductor devices other than the target semiconductor device. In this case, the third voltage may be set to have a value of 33% to 66% of a difference between the first voltage and the second voltage applied to the target semiconductor device.

For example, the above-described four elements S1, S2, S3, and S4 constitute the synaptic array. When the first device S1 is set as a target device for weight control, a program voltage VPGM is applied to the first gate line 101 of the first device S1 and the third device S3, and a half voltage VPGM/2 of the program voltage VPGM is applied to the second gates of the third device S3 and the fourth device S4. In addition, the first gate line 102 of the second device S2 and the fourth device S4 is grounded.

The program voltage VPGM is applied to the first gate line 101 of the first device S1 and the third device S3, and the second gate and the second gates and the drain line 501 are grounded to form an FN tunneling condition. In addition, a half voltage VPGM/2 of the program voltage VPGM is applied to the second gates and the drain line 502 of the third device S3 and the fourth device S4.

In this case, when a length of the end portion 510 is increased, the voltage VPGM/2 of the source 320 does not affect a channel side due to overlap given by the second gate 500. Accordingly, when the length of the end portion 510 is increased, program efficiency is increased. When the length of the end portion 510 is reduced, the voltage VPGM/2 of the source 320 may be transferred to the channel. Accordingly, when the length of the end portion 510 is reduced, the program efficiency is reduced, but a highly integrated array may be implemented.

Figure 5:
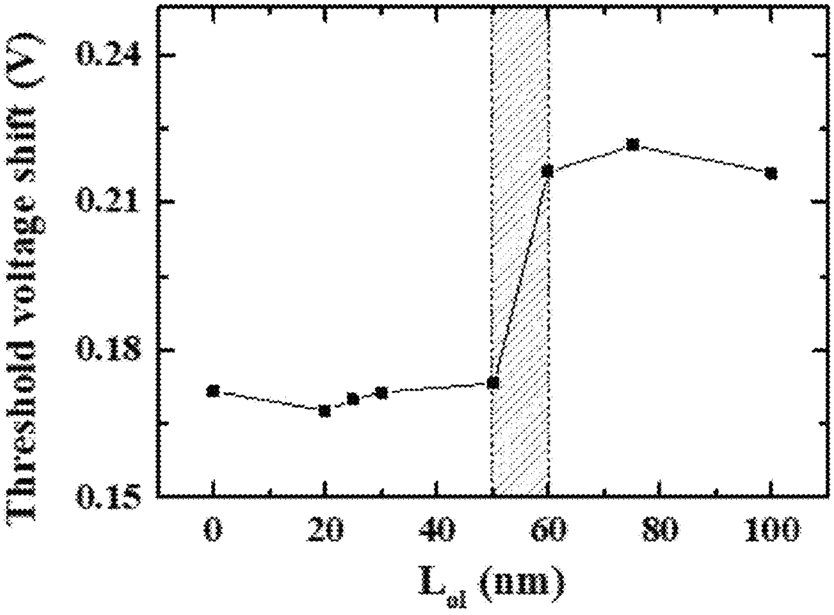
FIG. 5 is a graph illustrating a threshold voltage shift characteristics of the semiconductor device according to the example embodiment of the present disclosure.

Specifically, as illustrated in FIG. 5, when the length of the end portion 510 is 50 nm to 60 nm, threshold voltage shift characteristics of the semiconductor device 1 are greatly changed. When it is desired to increase the program efficiency by extending the length of the end portion 510, the end portion 510 may be set to have a value of 60 nm or more. In addition, when it is desired to form a highly integrated array by reducing the length of the end portion 510, the end portion 510 may be set to have a value of 40 nm or less.

In addition, as the fin 110 is formed to protrude from the center of the first gate 100 in a height direction, a length of the channel 300 is extended by twice the height of the fin 110, and thus, the semiconductor device 1 may precisely control weights with a low power.

Figure 6:
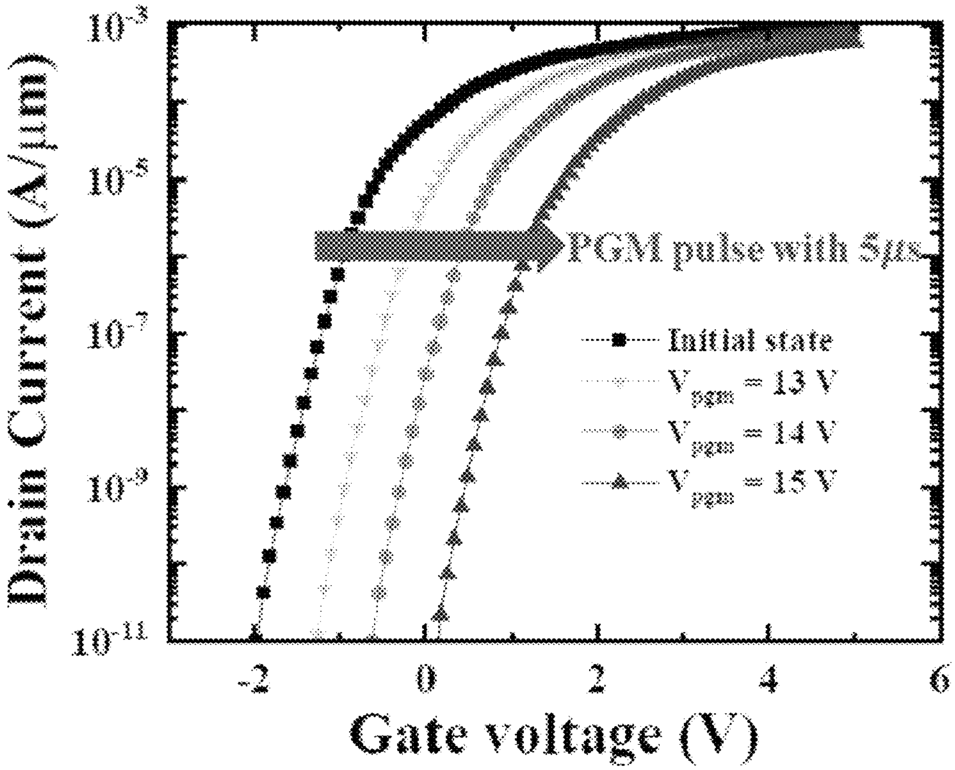
FIG. 6 is a graph of a current according to a gate voltage of the semiconductor device according to the example embodiment of the present disclosure.

FIG. 6 illustrates a drain current value according to a gate voltage of the semiconductor device 1 according to an example embodiment of the present disclosure.

FIG. 6 illustrates a drain current value according to a gate voltage in an initial state, when the program voltage VPGM is 13V, 14V, or 15V. As illustrated in FIG. 4, as the program voltage increases, a graph of the initial state moves to the right, and the amount of drain current may be controlled even with a low power.

Specifically, by injecting electrons or holes through FN tunneling, a weight of the semiconductor device 1 may be adjusted. The weight is stored in the long term by the injected charges, and a multiplication of the stored weight and a voltage is represented as a current. Accordingly, in order to allow a current to flow from a large number of synapses at a neuronal end for a vector multiplication operation, a low-power operation has to be able to be performed, and this may be solved by increasing a length of an effective channel.

In addition, multiple weights may be stabilized by increasing the length of the effective channel. In addition, as the length of the effective channel is increased, a short-channel effect may be reduced, and non-uniformity between the semiconductor devices 1 may be reduced. In addition, as an effective volume of a long-term memory increases, weights that the synaptic device may represent may be stabilized.

Hereinafter, channel electron density of the semiconductor device 1 will be described with reference to FIG. 7.

Figure 7:
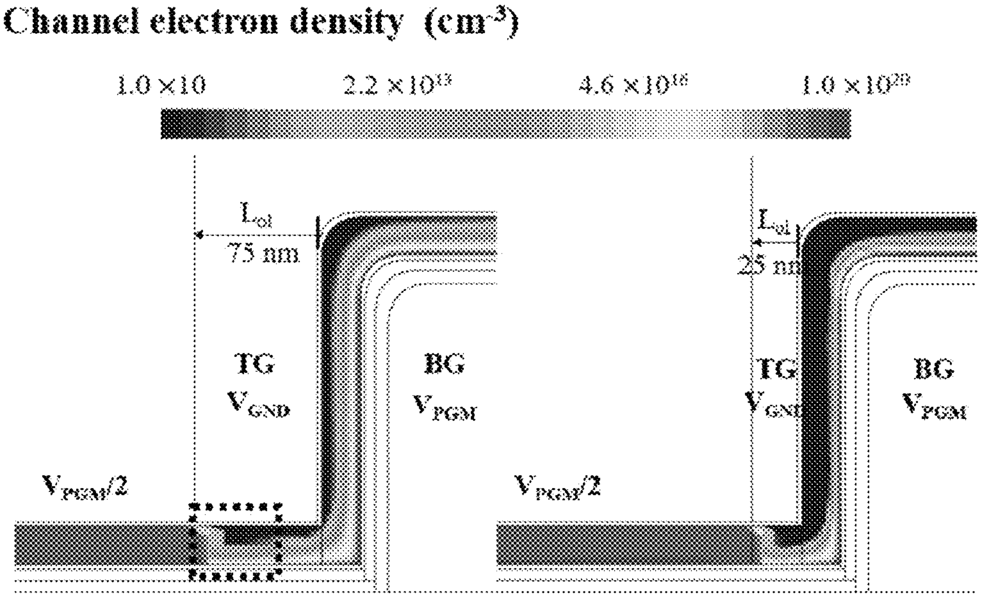
FIG. 7 is a graph of channel density of the semiconductor device according to the embodiment of the present disclosure.

FIG. 7 illustrates electron density when the end portion 510 is formed to be 75 nm, and the electron density when the end portion 510 is formed to be 25 nm.

As illustrated in FIG. 7, as the fin 110 is formed to protrude from the center of the first gate 100 in a height direction, the channel is blocked when moving away from the first gate 100 by a certain distance or more.

A semiconductor device including an overpass-type channel according to the embodiment of the present disclosure may increase a length of an effective channel.

In addition, the semiconductor device including the overpass-type channel according to the embodiment of the present disclosure may stabilize a weight of a synaptic device.

In addition, an operation method of a device according to the embodiment described above may be according to the known operation method, and in particular, an operation method of a synaptic mimic device may refer to Korean Patent Registration No. 10-1425857 of the present applicant.

The above descriptions on the present disclosure are for illustration, and those skilled in the art to which the present disclosure pertains may understand that the descriptions may be easily modified into other specific forms without changing the technical idea or essential features of the present disclosure. Therefore, it should be understood that the embodiments described above are illustrative in all respects and not restrictive. For example, each component described as a single type may be implemented in a dispersed form, and likewise components described as distributed may be implemented in a combined form.

The scope of the present disclosure is indicated by the following claims rather than the above detailed description, and all changes or modifications derived from the meaning and scope of the claims and their equivalents should be interpreted as being included in the scope of the present disclosure.

Mode for Implementing the Invention

A mode for implementing the invention is the same as the best mode for implementing the above-described invention.

INDUSTRIAL APPLICABILITY

Since the present disclosure is applicable to a semiconductor industry as a semiconductor device technology, the present disclosure has industrial applicability.

What is claimed is:

1. An overpass-type semiconductor device comprising:

a first gate including a fin having a preset height;

a charge storage layer formed on the first gate and the fin;

a channel layer formed on a part of the charge storage layer and configured to overpass the fin of the first gate;

a gate insulating layer formed on the channel layer;

a second gate formed on the gate insulating layer and configured to extend in a direction parallel to an overpassing direction of the channel layer; and a source and a drain formed in the channel layer to be separated from each other by a preset distance on both sides of the fin, wherein the fin protrudes in a height direction from a center of the first gate, and wherein the drain shares a same voltage line as the second gate.

2. The overpass-type semiconductor device of claim 1, further comprising:

a tunneling insulating layer formed between the channel layer and the charge storage layer; and a blocking insulating layer formed between the charge storage layer and the first gate.

3. The overpass-type semiconductor device of claim 1, wherein at least one grain boundary is provided between the source and the drain.

4. The overpass-type semiconductor device of claim 1, wherein the second gate surrounds the fin.

5. The overpass-type semiconductor device of claim 1, wherein the source and the drain are formed in a pn junction, and charges generated by Fowler-Nordheim (FN) tunneling by voltages of the first gate and the second gate are stored in the charge storage layer.

6. A synaptic array comprising:

first to fourth semiconductor devices arranged in an array, each of the first to fourth semiconductor devices includes a first gate including a fin having a preset height, a charge storage layer formed on the first gate and the fin, a channel layer formed on a part of the charge storage layer and configured to overpass the fin of the first gate, a gate insulating layer formed on the channel layer, and a second gate formed on the gate insulating layer and configured to extend in a direction parallel to an overpassing direction of the channel layer, the fin protrudes in a height direction from a center of the first gate, one second gate line connecting the second gate of the first semiconductor device to the second gate of the second semiconductor device;

another second gate line connecting the second gate of the third semiconductor device to the second gate of the fourth semiconductor device;

one drain line shared by the first semiconductor device and the second semiconductor device;

another drain line shared by the third semiconductor device and the fourth semiconductor device;

one first gate line connecting the first gate of the first semiconductor device to the first gate of the third semiconductor device;

another first gate line connecting the first gate of the second semiconductor device to the first gate of the fourth semiconductor device;

one source line shared by the first semiconductor device and the third semiconductor device; and another source line shared by the second semiconductor device and the fourth semiconductor device, wherein an event-driven operation of simultaneously receiving an input signal to the second gate lines and the drain lines and outputting an output signal from the first and second source lines is enabled.

7. A control method of a synaptic array according to claim 6, the control method comprising:

setting any one semiconductor device among the first to fourth semiconductor devices as a target semiconductor device for which a synaptic weight is to be set;

applying a first voltage to the first gate of the target semiconductor device; and setting a weight of the target semiconductor device by applying a second voltage to the second gate and a drain of the target semiconductor device.

8. The control method of claim 7, further comprising:

applying one of the second voltage and a third voltage to first gates of other semiconductor devices other than the target semiconductor device among the first to fourth semiconductor devices; and applying one of the second voltage and the third voltage to second gates and drains of the other semiconductor device.

9. The control method of claim 8, wherein the applying of the third voltage comprises setting the third voltage to have a value of 33 to 66% of a voltage difference between the first voltage and the second voltage applied to the target semiconductor device.

* * * * *